Aug. 7, 1962 R. P. CROW ET AL 3,048,659

MICROPHONE PREAMPLIFIER

Original Filed Dec. 2, 1954

INVENTOR.
Robert P. Crow
BY Gilbert J. Vollink

Mueller & Aichele Attys.

3,048,659
MICROPHONE PREAMPLIFIER

Robert P. Crow, Park Ridge, and Gilbert J. Vollink, Villa Park, Ill., assignors to Motorola, Inc., Chicago, Ill., a corporation of Illinois Continuation of abandoned application Ser. No. 472,672, Dec. 2, 1954. This application Mar. 30, 1959, Ser. No. 803,045
2 Claims. (Cl. 179—1)

The present invention relates to transistor amplifiers, and more particularly to a transistor amplifier that is especially suited as a preamplifier for a dynamic microphone. This application is a continuation of our copending application Serial No. 472,672, filed December 2, 1954, now abandoned.

The need has existed for an amplifier that could be used with a dynamic type microphone so that the advantages of high fidelity and low noise inherent in this type of microphone could be combined with the advantage of high output such as obtained from a carbon microphone. It is most desirable that such an amplifier be small, simple and easily powered so that it may be built into the casing of the microphone itself and thus reduce the effects of hum pickup that occurs when the microphone leads have any appreciable length. The advent of the transistor made this type of amplifier possible.

It is, accordingly, an object of the present invention to provide an improved transistor amplifier of the above described type that is suitable for use as a dynamic microphone preamplifier.

Another object of the invention is to provide such an improved transistor amplifier that is eminently simple and compact in its design so that it may be incorporated directly in the casing of the microphone.

A feature of the invention is the provision of a transistor amplifier that incorporates but a single transistor stage, and which utilizes a single pair of leads to serve the dual purpose of receiving the D.C. power for the amplifier and of providing the audio output. This construction not only enables the amplifier to be conveniently mounted in the microphone casing without increasing its size unduly, but also keeps the number of leads extending from the microphone-amplifier assembly to a minimum.

Figure 1:
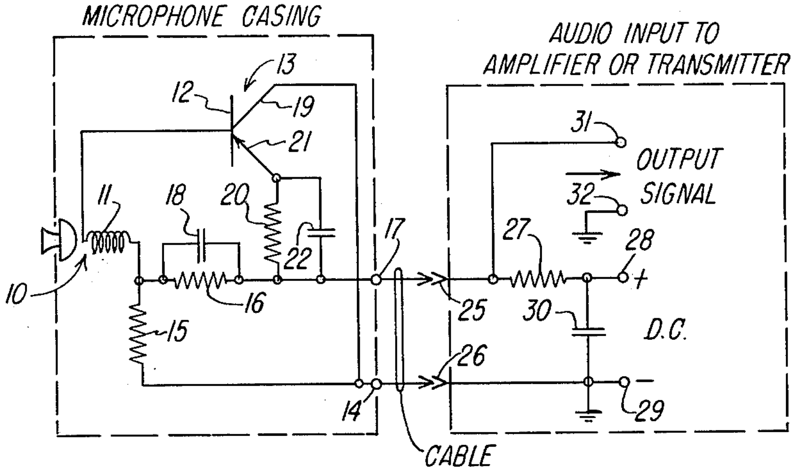
Figures 2, 3:
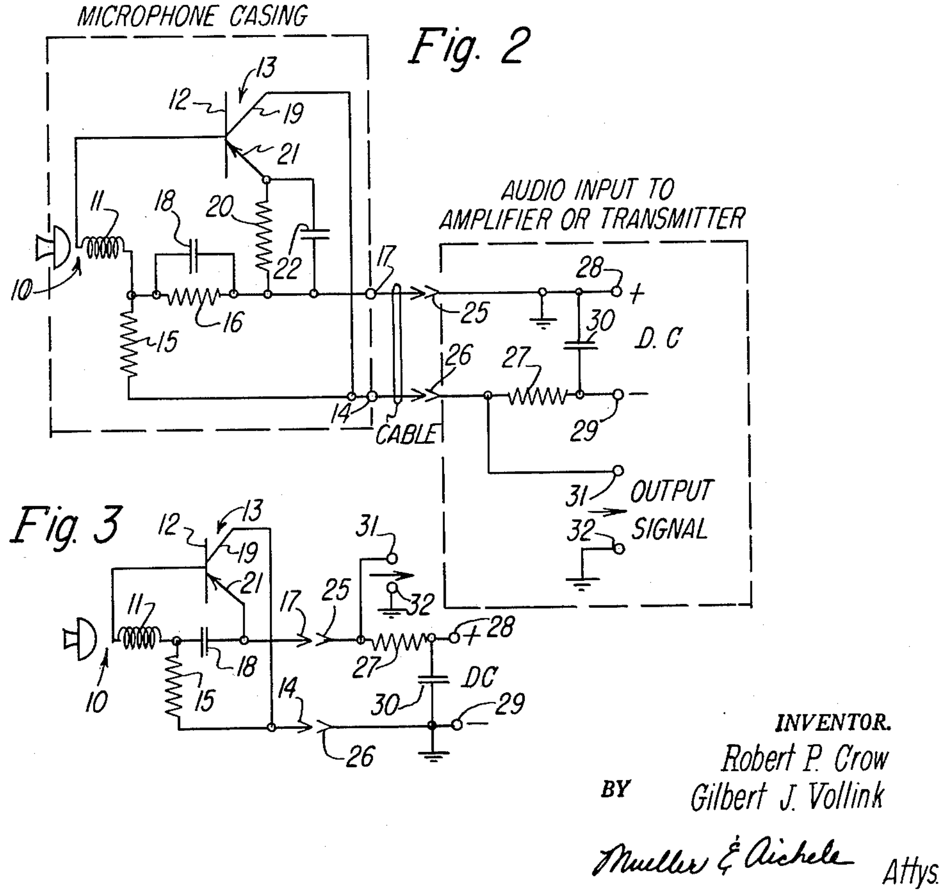

The above and other features of the invention which are believed to be new are set forth with particularity in the appended claims. The invention itself, however, together with further objects and advantages thereof may best be understood by reference to the following description when taken in conjunction with the accompanying drawing, in which:

FIG. 1 shows one embodiment of the transistor microphone preamplifier of the present invention; and FIGS. 2 and 3 show a modification of the circuit.

The invention provides an amplifier including in combination a transistor having a base electrode, an emitter electrode and a collector electrode. An input circuit is provided which includes the inductance coil of a microphone, with one side of the inductance coil being connected to the base electrode. First resistor means connects the other side of the inductance coil to a first output terminal, and second and third resistance means are series connected from the junction of the coil and the first resistor means to the emitter electrode. The second and third resistor means are by-passed respectively by first and second capacitor means. A connection extends from the junction of the second and third resistor means to a second output terminal, and another connection extends from the collector electrode to the first output terminal.

A pair of input terminals are provided which are adapted to receive the output terminals referred to above.

A direct current load impedance element connects one of the input terminals to the positive terminal of a source of unidirectional potential, and a connection extends from the first input terminal to the negative terminal of the source. Capacitor means is connected across the positive and negative terminals to by-pass the source, and a load output terminal is connected to the load impedance to derive an output signal from the amplifier.

The circuit of FIG. 1 includes a dynamic microphone 10 having an inductance winding 11. One side of the winding is connected to the base electrode 12 of a transistor 13 and the other side is connected to an output terminal 14 through a resistor 15. The junction of winding 11 and resistor 15 is connected through a resistor 16 to a second output terminal 17, and resistor 16 is shunted by a capacitor 18. Terminal 14 is directly connected to the collector electrode 19 of transistor 13, and terminal 17 is connected through a resistor 20 to the emitter electrode 21 of the transistor, resistor 20 being shunted by a capacitor 22.

Terminals 14 and 17 represent the output terminals of the transistor-amplifier combination, it being understood that the combination may be mounted within a single casing. Terminals 14 and 17 are connected through a two lead cable to the audio input circuit of the transmitter, public address system, etc., with which the assembly is to be associated by way of input terminals 25 and 26. Input terminal 25 receives the terminal 17 and input terminal 26 receives terminal 14. Terminal 26 is connected directly to ground, and terminal 25 is connected through a load resistor 27 to the positive terminal 28 of a direct current source of, for example, six volts. The negative terminal 29 of the source is connected directly to ground, and the source is by-passed by a capacitor 30. Load output terminal 31 is connected to the junction of terminal 25 and load resistor 27, and a second load output terminal 32 is connected to the grounded negative terminal of the D.C. source. Load resistor 27 may be replaced by an output transformer when so desired or other suitable impedance element.

The amplifier is connected as a common emitter type of circuit. The input signal from microphone 10 is impressed through capacitors 18 and 22 between the emitter and base electrodes, and the output is derived across resistor 27 through capacitors 22 and 30 from between the collector and emitter electrodes. That is, the load resistor 27 is in series with the emitter and collector electrodes, and the emitter electrode is common to the input and output circuits.

Resistors 15, 16 and 20 are for biasing purposes. Resistors 15 and 16 provide a relatively fixed small negative voltage on the base 12 with respect to the emitter 21, which causes emitter current to flow. Resistor 20 reduces the emitter current and tends to oppose any increase therein so as to control this current in a manner similar to that of a cathode resistor in a vacuum tube circuit. This type of self-biasing system tends to reduce the effects of different transistor characteristics and also the effects of temperature and supply voltage changes.

Resistor 20 is by-passed by capacitor 22 to overcome any degenerative effect due to this resistor. Resistor 16 in series with the amplifier input circuit is relatively small and causes only a small loss in gain, so that its by-passing capacitor 18 is not absolutely necessary. It can be seen that the D.C. power is supplied to the transistor circuit and the A.C. output is supplied to terminals 31, 32 over but a single pair of leads, and also that the amplifier is extremely simple in its construction and is suitable for mounting in a compact microphone casing.

The circuit of FIG. 2 is similar to that of FIG. 1 and like reference numerals have been used. The circuit of FIG. 2 is intended to be used with a D.C. source in which the positive terminal is grounded. For such a connection, the load resistor 27 is included in the negative lead from terminal 26 as shown.

In a constructed embodiment of the invention, the following constants were used, and these are listed herein merely by way of example, and are not intended to limit the invention in any way:

| | | |
|---|---|---|
| Capacitor **18** (6 volt tantalum capacitor) | microfarads | 25 |
| Resistor **20** | ohms | 10 |
| Resistor **16** | do | 220 |
| Resistor **15** | do | 10,000 |
| Resistor **27** | do | 560 |

The embodiments of FIGS. 1 and 2 can be still further simplified, as shown by the circuit of FIG. 3. The latter circuit has less stabilization than the former but is still satisfactory for many applications. In the arrangement of FIG. 3, the stabilizing resistor is removed from the emitter connection and the forced D.C. bias is removed from the base.

The invention provides, therefore, an exceedingly simple transistor amplifier that is eminently suitable for use as a preamplifier for a dynamic microphone. The amplifier uses a minimum of components and simplified circuitry which enables it to be conveniently mounted within a relatively small microphone casing, and it uses but a single pair of leads for connecting the microphone-amplifier combination to the input circuit of the transmitter proper.

What is claimed is:

1. An amplifier and microphone system including in combination, a microphone with a casing therefor, first amplifier circuit means included within said casing and having a transistor with base, emitter and collector electrodes, a cable connected to said first circuit means including first and second conductors, said first conductor being directly connected to said collector electrode, direct current conducting means connecting said second conductor to said emitter electrode, a voltage divider comprising first and second resistor means directly connected between first and second conductors, means connecting said microphone between the junction of said resistor means and said base electrode for applying signals to said transistor and biasing said base electrode, second amplifier circuit means external to, and remote from, said casing of said microphone and including interconnection thereto by said cable, said second amplifier circuit means including an output load impedance for said first amplifier circuit means comprising the sole load impedance therefor, said second amplifier circuit means further including an audio signal bypass capacitor series connected with said output load impedance across said first and second conductors, and direct current power supply means connected across said bypass capacitor, whereby quiescent energization for, and output signal coupling from, said first amplifier circuit means is provided solely by said first and second conductors.

2. An amplifier and microphone system including in combination, a dynamic microphone having an inductive winding and an enclosing casing, first amplifier circuit means included within said casing and having a transistor with base, emitter and collector electrodes, first capacitor means coupling said microphone between said base and emitter electrodes, a cable coupled to said system and including a first cable conductor directly connected to said collector electrode and establishing a ground reference for said system, an emitter bias resistor, said cable including a second cable conductor connected through said bias resistor to said emitter electrode, a voltage divider connected between said first and second cable conductors and having an intermediate tap connected through said dynamic microphone to said base electrode to provide bias therefor, second amplifier circuit means external to, and remote from, said casing of said dynamic microphone and including interconnection thereto by said first and second cable conductors, said second amplifier circuit means including a resistive output load impedance for said first amplifier circuit means and second capacitor means series connected across said cable conductors with said second capacitor means connected to said first cable conductor, and direct current power supply means connected across said second capacitor means whereby quiescent energization for, and output signal coupling from, said first amplifier circuit means is provided solely by said first and second cable conductors.

References Cited in the file of this patent

UNITED STATES PATENTS

| | | |
|---|---|---|
| 2,762,870 | Sziklai et al. | Sept. 11, 1956 |
| 2,774,826 | Moulon | Dec. 18, 1956 |
| 2,784,262 | Crow | Mar. 5, 1957 |
| 2,842,623 | Lehr | July 8, 1958 |
| 2,929,877 | Irick | Mar. 22, 1960 |

FOREIGN PATENTS

| | | |
|---|---|---|
| 862,917 | Germany | Jan. 15, 1953 |